(12) United States Patent
Shin et al.

(10) Patent No.: US 8,095,343 B2
(45) Date of Patent: Jan. 10, 2012

(54) METHOD AND APPARATUS FOR MODELING SOURCE-DRAIN CURRENT OF THIN FILM TRANSISTOR

(75) Inventors: Jae Heon Shin, Daejeon (KR); Chi Sun Hwang, Daejeon (KR); Min Ki Ryu, Seoul (KR); Woo Seok Cheong, Daejeon (KR); Hye Yong Chu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 679 days.

(21) Appl. No.: 12/201,457

(22) Filed: Aug. 29, 2008

(65) Prior Publication Data

US 2009/0157372 A1  Jun. 18, 2009

(30) Foreign Application Priority Data

Dec. 17, 2007  (KR) .................. 10-2007-0132724

(51) Int. Cl.
*G06F 17/11* (2006.01)
(52) U.S. Cl. ................ 703/2; 703/13; 703/14; 716/100; 716/106
(58) Field of Classification Search .............. 703/2, 13, 703/14; 716/104, 136, 100, 106
See application file for complete search history.

(56) References Cited

U.S. PATENT DOCUMENTS

| | | | | |
|---|---|---|---|---|
| 5,334,950 A * | 8/1994 | Arimoto | .................. | 330/264 |
| 5,467,291 A * | 11/1995 | Fan et al. | .................. | 703/14 |
| 6,337,249 B1 * | 1/2002 | Yamane et al. | .............. | 438/279 |
| 6,421,390 B1 * | 7/2002 | Burkhart | .................. | 375/257 |
| 6,567,773 B1 * | 5/2003 | Rahmat et al. | ............... | 703/14 |
| 7,100,131 B2 * | 8/2006 | Honda | .................. | 716/136 |
| 7,282,943 B2 * | 10/2007 | Sakaguchi et al. | ........ | 324/762.09 |
| 7,463,988 B2 * | 12/2008 | Inoue et al. | ..................... | 702/65 |
| 7,519,930 B2 * | 4/2009 | Mori | .............................. | 716/106 |
| 7,685,543 B2 * | 3/2010 | Tsuji et al. | .................... | 716/106 |
| 7,934,175 B2 * | 4/2011 | Kotani et al. | ................... | 716/54 |
| 2005/0104614 A1 * | 5/2005 | Sakaguchi et al. | ............ | 324/765 |
| 2006/0033447 A1 * | 2/2006 | Chikamatsu et al. | ...... | 315/169.3 |
| 2008/0028342 A1 * | 1/2008 | Tsuji et al. | ........................ | 716/2 |

(Continued)

FOREIGN PATENT DOCUMENTS

| | | |
|---|---|---|
| JP | 11-330491 A | 11/1999 |
| JP | 2000-133800 A | 5/2000 |
| KR | 2003-0093010 A | 12/2003 |

(Continued)

OTHER PUBLICATIONS

D. Dosev, B. Iniguez, J. Pallares, L. Marsal, T. Ytterdal, "Simulation and Modeling of Nanocrystalline Silicon Thin Film Transistors", 2002, pp. 1-4.*

(Continued)

*Primary Examiner* — Kamini S Shah
*Assistant Examiner* — Kibrom Gebresilassie
(74) *Attorney, Agent, or Firm* — Rabin & Berdo, P.C.

(57) ABSTRACT

Provided are a method and apparatus for modeling source-drain current of a TFT. The method includes receiving sample data, the sample data including a sample input value and a sample output value; adjusting modeling variables according to the sample data; calculating a current model value according to the adjusted modeling variables; when a difference between the calculated current model value and the sample output value is smaller than a predetermined threshold value, fitting a current model by applying the adjusted modeling variables to the current model; applying actual input data to the fitted current model; and outputting a result value corresponding to the actual input data, wherein the current model is a model for predicting the source-drain current of the TFT.

7 Claims, 3 Drawing Sheets

U.S. PATENT DOCUMENTS

| | | | |
|---|---|---|---|
| 2008/0126064 A1* | 5/2008 | Tseng et al. | 703/14 |
| 2008/0164902 A1* | 7/2008 | Sakaguchi et al. | 324/770 |
| 2008/0244477 A1* | 10/2008 | Miura et al. | 716/4 |
| 2008/0309365 A1* | 12/2008 | Liao et al. | 324/769 |
| 2009/0119085 A1* | 5/2009 | Ma et al. | 703/14 |
| 2010/0001983 A1* | 1/2010 | Abe | 345/211 |

OTHER PUBLICATIONS

D. Dosev, B. B Iniguez, J. Pallares, T. Ytterdal, L. Marsal, "Simulation and Modeling of Nanocrystalline Silicon Thin Film Transistors", 2002, pp. 1-4.*

D. Dosev, T. Ytterdal, J. Pallares, L. F. Marsal, B. Iniguez, "DC SPICE model for Nanocrystalline AND Microcrystalline Silicon TFTs", IEEE vol. 49, No. 11, Nov. 2002, pp. 1979-1984.*

"A new analytical model for amorphous-silicon thin-film transistors including tail and deep states", L. Colalongo, Solid-State Electronics 45 (2001) 1525-1530.

SPICE Models for Amorphous Silicon and Polysilicon Thin Film Transistors, Michael S. Shur et al., .J, Eleotrochem. Soc, vol. 144, No. 8, Aug. 1997, pp. 2833-2839.

* cited by examiner

| | C(F) | $K_b$ | b | $V_F$ (V) | $K_a$ | a | $V_T$ (V) | $V_{min}$ | |
|---|---|---|---|---|---|---|---|---|---|
| ZnO | 12e-8 | 0.0505 | 2.14 | 0.0373 | 3.162 | 0.533 | 3.85 | 4.1 | 4.1 |
| IGZO | 3.6e-8 | 0.00198 | 3.25 | 1.0 | 1.254 | 0.578 | 5.36 | 3.2 | 3.0 |

METHOD AND APPARATUS FOR MODELING SOURCE-DRAIN CURRENT OF THIN FILM TRANSISTOR

CROSS-REFERENCE TO RELATED APPLICATION

This application claims priority to and the benefit of Korean Patent Application No. 2007-132724, filed Dec. 17, 2007, the disclosure of which is incorporated herein by reference in its entirety.

BACKGROUND

1. Field of the Invention

The present invention relates to a method and apparatus for modeling source-drain current of a thin film transistor (TFT). More particularly, the present invention relates to a method and apparatus for modeling source-drain current of a TFT, which can be applied to oxide TFTs and organic TFTs, as well as amorphous silicon TFTs.

This work was supported by the IT R&D program of MIC/IITA [2006-S-079-02, Smart window with transparent electronic devices].

2. Discussion of Related Art

Conventional transistor prediction modeling scheme for silicon MOSFETs (eg. AIM-SPICE, Silvaco-UTMOST, etc.) has been applied to amorphous or polycrystalline silicon thin film transistors (TFTs) used as switching or driving transistors for a display, such as an Active Matrix Liquid Crystal Display (AM LCD) or an Active Matrix-Organic Light-Emitting Diode (AM-OLED). However, since such conventional prediction model for silicon TFTs is not well applied to oxide (ZnO-based) semiconductor TFTs, which is recently expected to be used to transparent panels and flexible panels, it is difficult to perform element analysis and circuit design for the oxide TFTs.

This is because defects on numerous crystal boundaries in an oxide semiconductor TFT having nano-crystallinity trap most electrons induced by a gate bias and there is a characteristic that electron mobility itself is represented as a function of the gate bias. It is also difficult to directly apply a model for amorphous silicon TFTs to InGa—ZnO (IGZO) TFTs due to a high density of defects. Thus, there is a need for a prediction modeling method capable of being applied to organic TFTs and oxide TFTs, as well as amorphous TFTs.

SUMMARY OF THE INVENTION

The present invention is directed to a method and apparatus for modeling source-drain current of TFTs.

The present invention is also directed to a method and apparatus for modeling source-drain current of oxide TFTs and organic TFTs, as well as conventional amorphous TFTs.

One aspect of the present invention provides a method for modeling source-drain current of a TFT, the method comprising: receiving sample data, the sample data including a sample input value and a sample output value; adjusting modeling variables according to the sample data; calculating a current model value according to the adjusted modeling variables; when a difference between the calculated current model value and the sample output value is smaller than a predetermined threshold value, fitting a current model by applying the adjusted modeling variables to the current model; applying actual input data to the fitted current model; and outputting a result value corresponding to the actual input data, wherein the current model is a model for predicting the source-drain current of the thin film transistor.

The current model may be determined by the following equation: $I_{DS}=I_{leak}+(1/I_b+1/I_a)^{-1}$, where $I_{DS}$ denotes drain-source current, $I_{leak}$ denotes leakage current of a thin film transistor, $I_b$ denotes a first current value that is a source-drain current value calculated in a regime below a threshold voltage, and $I_a$ denotes a second current value that is a source-drain current value calculated in a regime above a threshold voltage. The TFT is one of an organic TFT, an oxide TFT and an amorphous silicon TFT.

The sample input value may comprise a drain voltage value and a gate voltage value, and the sample output value may be a source-drain current value measured according to the sample input value.

The first current value may be determined by the following equation:

$$I_b=(WC/L)(K_b/(b+2))(V_{GF}^{b+2}-(V_{GF}-V_D)^{b+2}) \text{ when } V_{GF}>0, \text{ and}$$

$$I_b=0 \text{ when } V_{GF} \leq 0$$

where $V_{GF}$ denotes a difference between a gate voltage and a flat band voltage, W denotes a channel width, C denotes gate insulating capacitance, L denotes a channel length, $V_D$ denotes a drain voltage, and $K_b$ and b denote modeling variable values. The second current value may be determined by the following equation:

$$I_a=(WC/L)(K_a/(a+2))(V_{GTe}^{a+2}-(V_{GTe}-V_D)^{a+2}),$$

where $V_{GTe}=(V_{min}/2)(1+(V_{GT}/V_{min})+(\Delta^2+(V_{GT}/V_{min}-1)^2)^{0.5})$, $V_{GT}$ denotes a difference between a gate voltage and a threshold voltage, W denotes a channel width, C denotes gate insulating capacitance, L denotes a channel length, $V_D$ denotes a drain voltage, Vmin denotes a minimum voltage, Ka and a denote modeling variable values, and $\Delta$ denotes a variable indicating convergence strength.

Another aspect of the present invention provides an apparatus for modeling source-drain current of a TFT, the apparatus comprising: a sample-data input unit for receiving sample data, the sample data including a sample input value and a sample output value; a variable adjusting unit for adjusting modeling variables according to the sample data; a model calculating unit for calculating a current model value according to the adjusted modeling variables; an error calculating unit for calculating a difference between the calculated current model value and the sample output value; an error determining unit for determining whether the difference is smaller than a predetermined threshold value, and establishing the adjusted modeling variables when the difference is smaller than the predetermined threshold value; a model applying unit for applying the modeling variables established by the error determining unit to the current model; and a result-value output unit for applying actual input data to the current model and outputting a result value corresponding to the actual input data, wherein the current model is a model for predicting the source-drain current of the TFT.

The current model may be determined by the following equation: $I_{DS}=I_{leak}+(1/I_b+1/I_a)^{-1}$, where $I_{DS}$ denotes drain-source current, $I_{leak}$ denotes leakage current of a thin film transistor, $I_b$ denotes a first current value that is a source-drain current value calculated in a regime below a threshold voltage, and $I_a$ denotes a second current value that is a source-drain current value calculated in a regime above a threshold voltage. The first current value and the second current value may be applied according to the threshold voltage. The TFT is one of an organic TFT, an oxide TFT and an amorphous silicon TFT.

The sample input value may comprise a drain voltage value and a gate voltage value, and the sample output value may be a source-drain current value measured according to the sample input value. The first current value may be determined by the following equation:

$$I_b = (WC/L)(K_b/(b+2))(V_{GF}^{b+2} - (V_{GF} - V_D)^{b+2}) \text{ when } V_{GF} > 0, \text{ and}$$

$$I_b = 0 \text{ when } V_{GF} \leq 0$$

where $V_{GF}$ denotes a difference between a gate voltage and a flat band voltage, W denotes a channel width, C denotes gate insulating capacitance, L denotes a channel length, $V_D$ denotes a drain voltage, and $K_b$ and b denote modeling variable values.

The second current value may be determined by the following equation:

$$I_a = (WC/L)(K_a/(a+2))(V_{GTe}^{a+2} - (V_{GTe} - V_D)^{a+2}),$$

where $V_{GTe} = (V_{min}/2)(1 + (V_{GT}/V_{min}) + (\Delta^2 + (V_{GT}/V_{min} - 1)^2)^{0.5})$, $V_{GT}$ denotes a difference between a gate voltage and a threshold voltage, W denotes a channel width, C denotes gate insulating capacitance, L denotes a channel length, $V_D$ denotes a drain voltage, $V_{min}$ denotes a minimum voltage, Ka and a denote modeling variable values, and $\Delta$ denotes a variable indicating convergence strength.

BRIEF DESCRIPTION OF THE DRAWINGS

The above and other features and advantages of the present invention will become more apparent to those of ordinary skill in the art by describing in detail preferred exemplary embodiments thereof with reference to the attached drawings in which.

DETAILED DESCRIPTION OF EXEMPLARY EMBODIMENTS

A method and apparatus for modeling source-drain current of a TFT according to the present invention will be described in greater detail with reference to the accompanying drawings.

Figure 1:
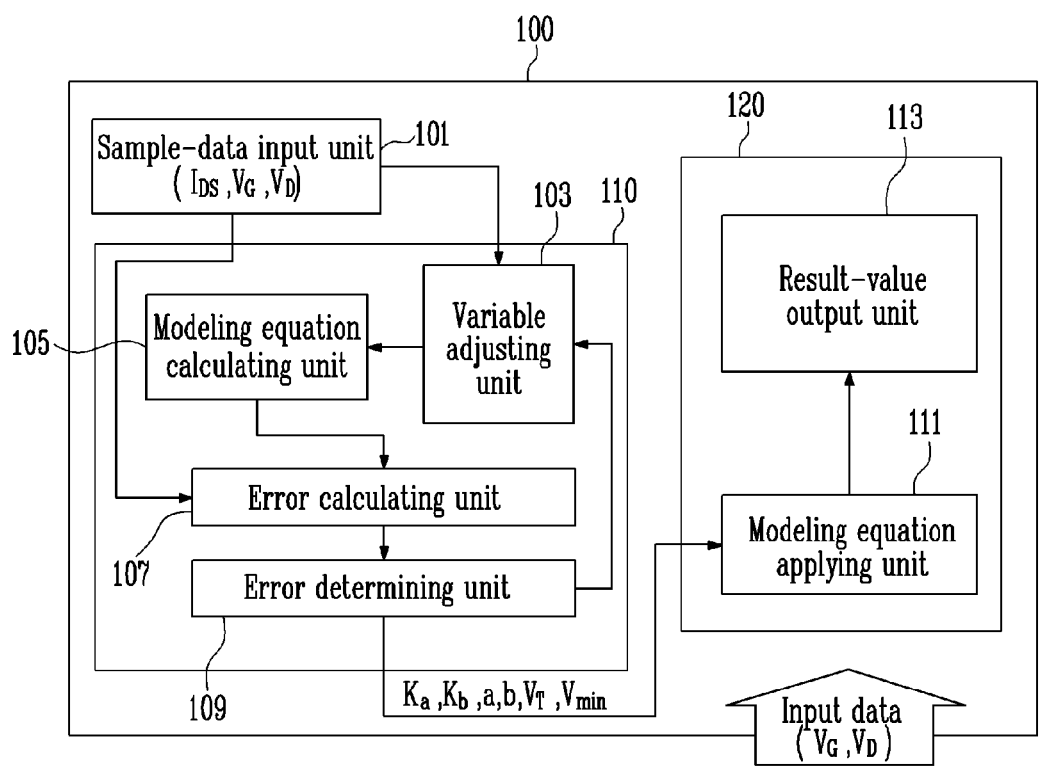
FIG. 1 is a block diagram illustrating an apparatus for modeling source-drain current of a TFT according to the present invention.

FIG. 1 is a block diagram of an apparatus for modeling source-drain current of a TFT according to the present invention. Referring to FIG. 1, a source-drain current modeling apparatus 100 according to the present invention includes a modeling-equation fitting unit 10 and a modeling-equation executing unit 120. The modeling-equation fitting unit includes a sample-data input unit 101, a variable adjusting unit 103, a modeling equation calculating unit 105, an error calculating unit 107, and an error determining unit 109.

The modeling-equation executing unit 120 includes a modeling equation applying unit 111 and a result-value output unit 113.

The modeling-equation fitting unit 110 establishes modeling variables so that the modeling equation according to the present invention operates suitably according to actual input data.

The sample-data input unit 101 receives external sample data for applying modeling according to the present invention. A modeling method includes predicting a resultant value in several different situations by receiving a few sample data and changing modeling variables using a modeling equation. In particular, the sample data includes not only input values used in the modeling equation according to the present invention, but also corresponding output values. That is, the sample-data input unit receives experimentally determined input and output values as the sample data.

The variable adjusting unit 103 applies the sample data input by the sample-data input unit to the modeling equation according to the present invention, and adjusts each modeling variables in order to extract modeling variables best fitted to the input sample data. In general, the modeling variable values are not determined at one time, but through iterative error modification using numerical analysis.

The modeling equation calculating unit 105 derives a temporary output value of the modeling equation using the temporary modeling variables determined by the variable adjusting unit 103. The result from the modeling equation calculating unit depends on the variable from the variable adjusting unit.

The error calculating unit 107 calculates a difference between the temporary output value from the modeling equation calculating unit 105 and the sample output value included in the sample data.

The error determining unit 109 determines whether the difference from the error calculating unit is smaller than a predetermined threshold value. If the difference is smaller than the predetermined threshold value, the error determining unit 109 establishes the modeling variables as modeling variables to be actually applied to the modeling equation. Otherwise, the error determining unit 109 causes variable adjusting unit 103 to adjust the variables again in order to establish more accurate modeling variables. This process is generally called a fitting process in a modeling process.

When the modeling variables are established by the modeling-equation fitting unit 110, the modeling-equation executing unit 120 applies several input values to the modeling equation and predicts an actual result.

The modeling equation applying unit 111 applies the established modeling variables to the modeling equation and establishes the modeling equation, and inputs actual input data to calculate an actual output value.

The result-value output unit 113 outputs the result value, which is obtained by the modeling equation applying unit 111, together with the input value, generally, in a graphic form.

The modeling equation is of most importance in the apparatus for modeling source-drain current of a TFT that performs the above processes.

The modeling equation according to the present invention may be expressed by:

$$I_{DS} = I_{leak} + (1/I_b + 1/I_a)^{-1},$$

where $I_{DS}$ denotes drain-source current, $I_{leak}$ denotes leakage current of a TFT, $I_b$ denotes a first current value, and $I_a$ denotes a second current value. In particular, $I_b$ denotes drain-source current below a threshold regime, and $I_a$ denotes drain-source current above a threshold regime. In particular, although $I_{leak}$ is leakage current of the TFT, it may be set to a proper constant. Alternatively, an equation that is more suitable for an oxide TFT may be used.

Here $I_a$ and $I_b$ are determined by equations:

$$I_b=(WC/L)(K_b/(b+2))(V_{GF}^{b+2}-(V_{GF}-V_D)^{b+2}) \text{ when } V_{GF}>0,$$

$$I_b=0 \text{ when } V_{GF} \leq 0, \text{ and}$$

$$I_a=(WC/L)(K_a/(a+2))(V_{GTe}^{a+2}-(V_{GTe}-V_D)^{a+2}),$$

where $V_{GF}$ denotes a difference between a gate voltage and a flat band voltage, W denotes a channel width, C denotes gate insulating capacitance, L denotes a channel length, $V_D$ denotes a drain voltage, $K_b$ and b denote modeling variable values, $V_{GTe}$ is defined as $(V_{min}/2)(1+(V_{GT}/V_{min})+(\Delta^2+(V_{GT}/V_{min}-1)^2)^{0.5}$, $V_{GT}$ denotes a difference between a gate voltage and a threshold voltage, $V_{min}$ denotes a minimum voltage, $K_a$ and a denote modeling variable values, and $\Delta$ is a variable indicating convergence strength.

The TFT may have a deep state and a tail state. It is known that a density of free electrons is proportional to $(V_G-V_F)^{2Td/T-1}$ in the deep state and $(V_G-V_T)^{2Tt/T-1}$ in the tail state. A total number of free electrons induced by gate bias is simply proportional to $(V_G-V_F)$ or $(V_G-V_T)$. Accordingly, when it is applied to a known equation of average electron mobility, $\mu_{avg}=\mu_{n*}(\mu_{free}/\mu_{induced})$, $\mu_{avg}$ is induced under a premise that it is proportional to $(V_G-V_F)^b$ below the threshold regime and $(V_G-V_T)^a$ above the threshold regime. Under this premise, the current values in the respective areas may be expressed by equations:

$$I_b = (WC/L)\int \mu_{avg}(V_G-V_F-V_y)dV_y,$$
$$= (WC/L)K_b\int (V_G-V_F-V_y)^{b+1}dV_y,$$
$$= (WC/L)(K_b/(b+2))((V_G-V_F)^{b+2} - (V_G-V_F-V_D)^{b+2})$$

$$I_a = (WC/L)\int \mu_{avg}(V_G-V_T-V_y)dV_y,$$
$$= (WC/L)K_a\int (V_G-V_T-V_y)^{a+1}dV_y,$$
$$= (WC/L)(K_a/(a+2))((V_G-V_T)^{a+2} - (V_G-V_T-V_D)^{a+2})$$

where $K_a$ and $K_b$ are proportional constant values. When $V_G-V_T<0$, the $I_a$ equation may not be established but divergent.

Accordingly, $V_{GTe}$ substituted for $(V_G-V_T)$ in the $I_a$ equation is defined by the following equation:

$$V_{GTe}=(V_{min}/2)(1+(V_{GT}/V_{min})+(\Delta^2+(V_{GT}/V_{min}-1)^2)^{0.5}.$$

where $V_{GT}$ simply denotes $V_G-V_T$. According to the $V_{GTe}$ equation, the $I_a$ equation may not diverge but converge on $V_{min}$ even when $V_G-V_T<0$.

Thus, the $I_a$ and $I_b$ equations are obtained which are applied to the modeling equation of the present invention, resulting in a final $I_{DS}$ equation.

Figure 3:
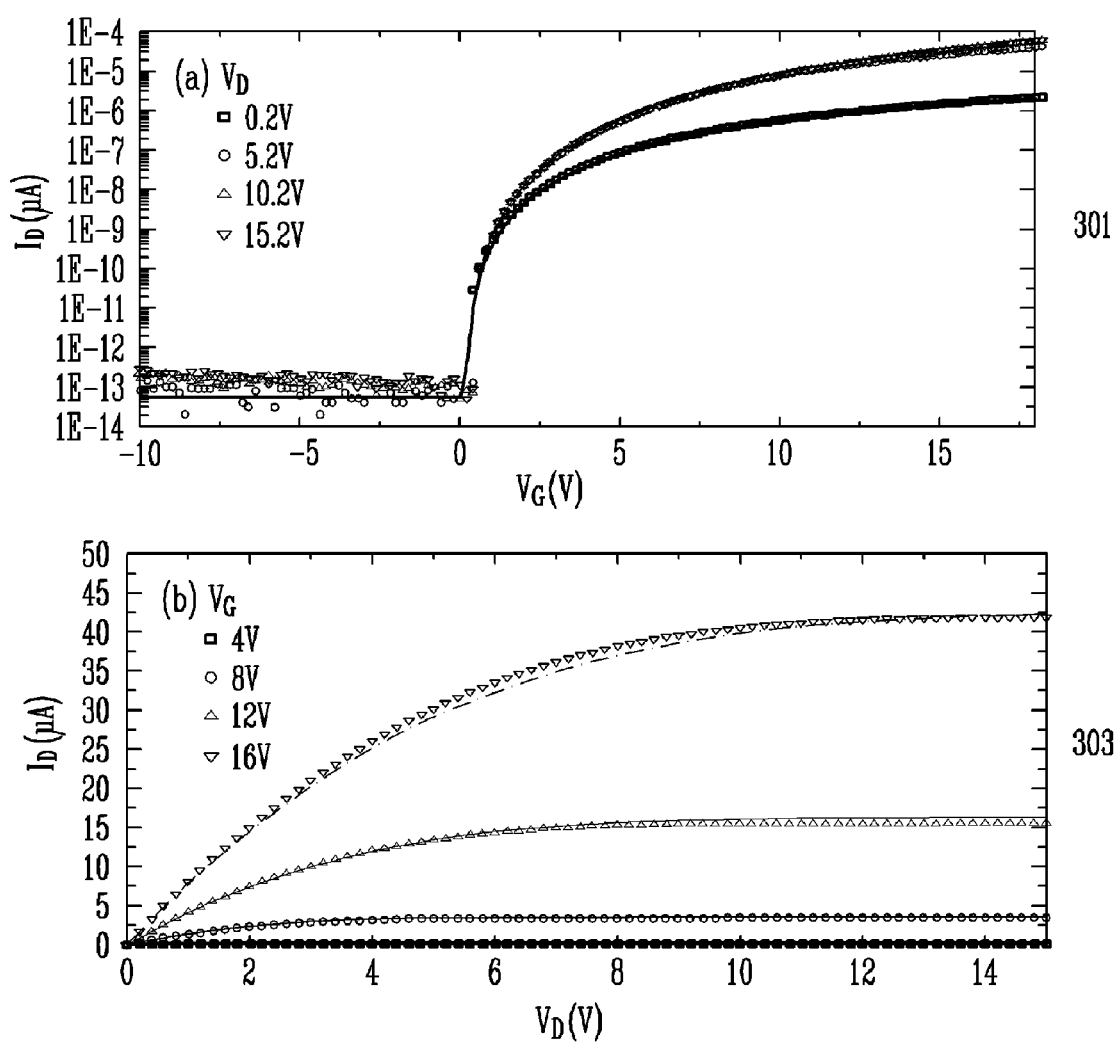
FIG. 3 illustrates modeling result values of an IGZO TFT according to an exemplary embodiment of the present invention.
Figures 4, 5:
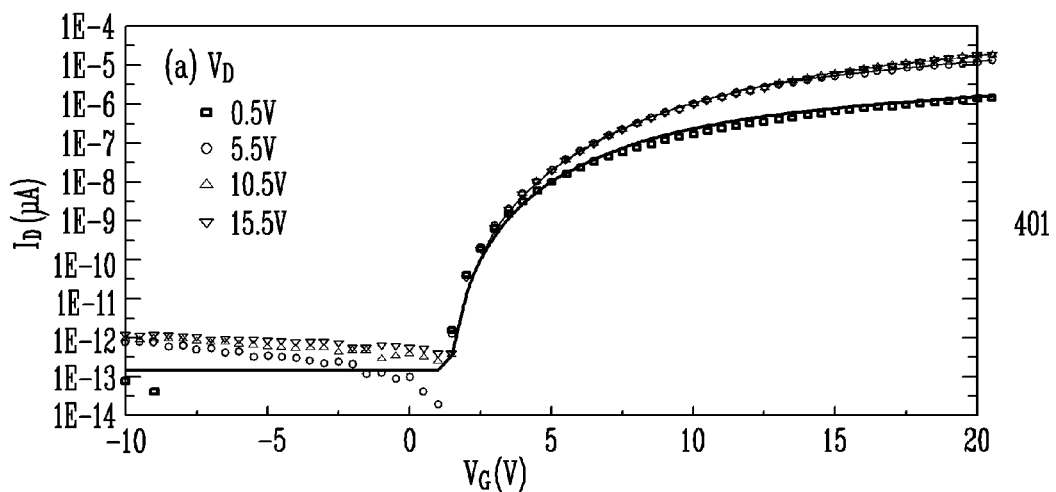
FIG. 4 illustrates modeling result values of a ZnO TFT according to an exemplary embodiment of the present invention.
FIG. 5 illustrates a table showing parameter values used in ZnO and IGZO TFTs according to an exemplary embodiment of the present invention.

With the present invention modeling equation determined by the above deriving process, it is possible to very accurately predict a source-drain current value even in organic semiconductor, oxide semiconductor, and amorphous silicon semiconductor, as illustrated in FIGS. 3 and 4, as compared to a conventional modeling equation.

Figure 2:
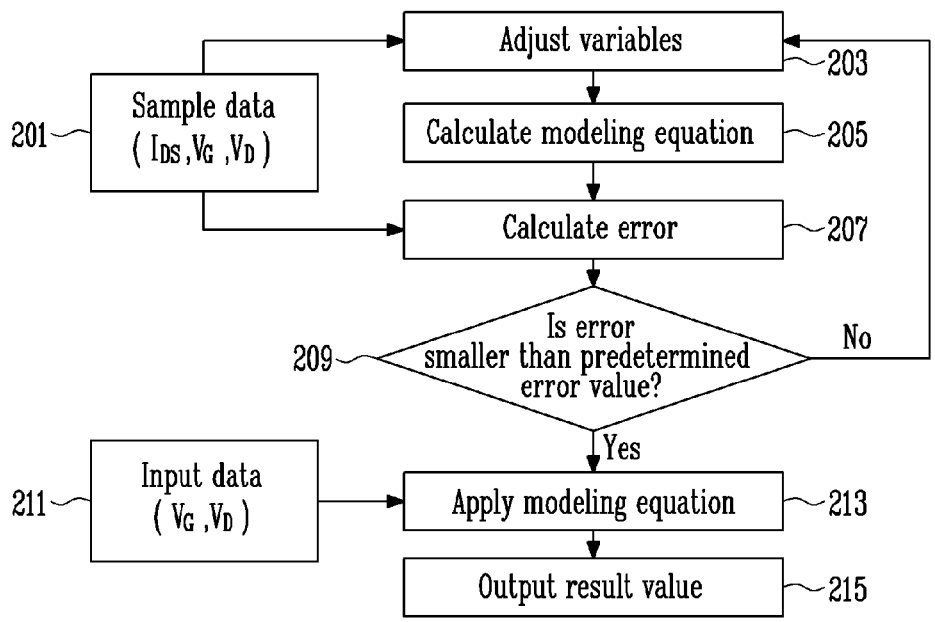
FIG. 2 is a flowchart illustrating a method for modeling source-drain current of a TFT according to the present invention.

FIG. 2 is a flowchart illustrating a method for modeling source-drain current of a TFT according to the present invention.

Referring to FIG. 2, in the method for modeling source-drain current of a TFT according to the present invention, external sample data is first received (step 201). The sample data is initially required for executing the modeling equation used in the modeling method. The sample data includes both a sample input value and a sample output value.

Modeling variables in the modeling equation according to the present invention are then adjusted according to the input sample data (step 203). The modeling equation according to the present invention is determined by equations:

$$I_{DS}=I_{leak}+(1/I_b+1/I_a)^{-1},$$

$$I_b=(WC/L)(K_b/b+2))(V_{GF}^{b+2}-(V_{GF}-V_D)^{b+2}) \text{ when } V_{GF}>0,$$

$$I_b=0 \text{ when } V_{GF} \leq 0, \text{ and}$$

$$I_a=(WC/L)(K_a/(a+2))(V_{GTe}^{a+2}-(V_{GTe}-V_D)^{a+2}),$$

as illustrated in FIG. 1. Here, the modeling variables may be, for example, a, b, $K_b$, $K_a$, and $V_{GTe}$. $V_{GTe}$ may be defined as $V_{GTe}=(V_{min}/2)(1+(V_{GT}/V_{min})+(\Delta^2+(V_{GT}/V_{min}-1)^2)^{0.5})$.

The modeling variables of the modeling equation are not determined at one time, but through iterative error modification using numerical analysis.

The modeling variable temporarily determined in step 203 is applied to the modeling equation according to the present invention to calculate a temporary modeling result value (step 205). Since the temporary modeling result value calculated by the modeling equation is a value obtained in a state where the variable adjustment has not yet completed, it is different from an actual result value.

After the temporary result value is derived using the modeling equation, the sample output value included in the sample data is compared with the temporary result value to calculate a difference therebetween, i.e., an error value (step 207).

A determination is then made as to whether the error value is smaller than a predetermined error value (step 209). If the error value is smaller than the predetermined error value, which means that there is no problem in applying the modeling equation actually, the adjusted modeling variable is actually applied to the modeling equation. Otherwise, the variable is again adjusted (step 203).

If it is determined in step 209 that the error value is smaller than the predetermined value, the modeling variable temporarily determined in step 203 is determined as a modeling variable to be used in the modeling equation.

The input drain and gate voltage values 211 are then applied to the modeling equation to calculate a source-drain current value (step 213). In general, a threshold of the error value may be 5%.

When the modeling equation is calculated, the source-drain current value corresponding to the input drain and gate voltage values is output (step 215).

With the above method, it is possible to accurately predict a source-drain current value even in organic semiconductor, oxide semiconductor, and amorphous silicon semiconductor, compared to a conventional modeling equation.

FIGS. 3 to 5 illustrate modeling result values of a TFT according to an exemplary embodiment of the present invention.

FIG. 3 illustrates modeling result values of an IGZO TFT according to an exemplary embodiment of the present invention.

In FIG. 3, a graph 301 shows a result value measured with a varying gate voltage. A dotted line indicates an actually measured value and a solid line indicates a value obtained by applying the modeling equation according to the present invention.

A graph 303 shows a result value measured with a varying drain voltage. A dotted line indicates an actually measured value and a solid line indicates a value obtained by applying the modeling equation according to the present invention. It can be seen from the graphs that use of the modeling scheme according to the present invention makes it possible to accurately predict the result value even in a TFT, such as an IGZO TFT, as opposed to conventional TFT modeling schemes.

FIG. 4 illustrates modeling result values of a ZnO TFT according to an exemplary embodiment of the present invention.

In FIG. 4, a graph 401 shows a result value measured with a varying gate voltage. In the graph, a dotted line indicates an actually measured value and a solid line indicates a value obtained by applying the modeling equation according to the present invention.

A graph 403 shows a result value measured with a varying drain voltage. A dotted line indicates an actually measured value and a solid line indicates a value obtained by applying the modeling equation according to the present invention. It can be seen from the graphs that use of the modeling scheme according to the present invention makes it possible to accurately predict the result value even in an oxide-based TFT, such as a ZnO TFT.

FIG. 5 illustrates a table showing parameter values used in ZnO and IGZO TFTs according to an exemplary embodiment of the present invention. It can be seen from the table that use of the modeling scheme of the present invention makes it possible to easily predict necessary parameters even in an oxide transistor or an IGZO transistor, as opposed to conventional modeling schemes.

The present invention can provide a method and apparatus for modeling source-drain current of TFTs.

Also, the present invention can provide a method and apparatus for modeling source-drain current of oxide TFTs and organic TFTs, as well as conventional amorphous TFTs.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method for modeling source-drain current of a thin film transistor (TFT), comprising:
   (a) receiving experimentally determined sample data, the sample data including sample input values and a sample output value;
   (b) adjusting modeling variables of a modeling equation according to the sample input values;
   (c) calculating a model output value according to the adjusted modeling variables;
   (d) repeating steps (b) and (c) with the adjusted modeling variables until a difference between the calculated model output value and the sample output value is smaller than a predetermined threshold value, the adjusted modeling variables when the difference becomes smaller than the threshold value being used as final modeling variables for the modeling equation;
   applying values for $V_G$ and $V_D$ as actual input data to the modeling equation with the final modeling variables, where $V_G$ is a gate voltage and $V_D$ is a drain voltage; and
   outputting a result value corresponding to the actual input data,
   wherein the modeling equation predicts the source-drain current of the TFT,
   wherein the modeling equation is $I_{DS}=I_{leak}+(1/I_b+1/I_a)^{-1}$, where $I_{DS}$ denotes drain-source current, $I_{leak}$ denotes leakage current of the TFT, $I_b$ denotes a first current value that is a source-drain current value calculated in a regime below a threshold voltage, and $I_a$ denotes a second current value that is a source-drain current value calculated in a regime above a threshold voltage,
   wherein the first current value is determined by equations:

$$I_b=(WC/L)(K_b/(b+2))(V_{GF}^{b+2}-(V_{GF}-V_D)^{b+2}) \text{ when } V_{GF}>0, \text{ and}$$

$$I_b=0 \text{ when } V_{GF}\leq 0$$

where $V_{GF}$ denotes a difference between a gate voltage and a flat band voltage, W denotes a channel width, C denotes gate insulating capacitance, L denotes a channel length, $V_D$ denotes a drain voltage, and $K_b$ and b denote modeling variable values, and
   wherein the second current value is determined by the following equation:

$$I_a=(WC/L)(K_a/(a+2))(V_{GTe}^{a+2}-(V_{GTe}-V_D)^{a+2}),$$

where $V_{GTe}=(V_{min}/2)(1+(V_{GT}/V_{min})+(\Delta^2+(V_{GT}/V_{min}-1)^2)^{0.5})$, $V_{GT}$ denotes a difference between a gate voltage and a threshold voltage, W denotes a channel width, C denotes gate insulating capacitance, L denotes a channel length, $V_D$ denotes a drain voltage, Vmin denotes a minimum voltage, ka and a denote modeling variable values, and $\Delta$ denotes a variable indicating convergence strength.

2. The method of claim 1, wherein the TFT is one of an organic TFT, an oxide TFT and an amorphous silicon TFT.

3. The method of claim 1, wherein the sample input values are a drain voltage value and a gate voltage value, and the sample output value is a source-drain current value measured according to the sample input values.

4. An apparatus for modeling source-drain current of a TFT, comprising:
   a sample-data input unit for receiving experimentally determined sample data, the sample data including sample input values and a sample output value;
   a modeling equation fitting unit for iteratively determining final modeling parameters for use in a modeling equation, the modeling equation fitting unit including;
      a variable adjusting unit for adjusting modeling variables of the modeling equation according to the sample input values;
      a model calculating unit for iteratively calculating trial model output values according to the adjusted modeling variables;
      an error calculating unit for calculating differences between the trial model output values and the sample output value;
      an error determining unit for determining when one of the differences is smaller than a predetermined threshold value, and establishing the final modeling variables when the difference is smaller than the predetermined threshold value;
   a model applying unit for applying the modeling variables established by the error determining unit to the modeling equation; and
   a result-value output unit for applying values for $V_G$ and $V_D$ as actual input data to the modeling equation and outputting a result value corresponding to the actual input data, where $V_G$ is a gate voltage and $V_D$ is a drain voltage, wherein the sample-data input unit, the modeling equation taking unit, the variable adjusting unit, the model calculating unit, the error calculating unit, the error determining unit, the model applying unit, and the result-value output unit are implemented in a computer, wherein the modeling equation predicts the source-drain current of the TFT, wherein the modeling equation is $I_{DS}=I_{leak}+(1/I_b+1/I_a)^{-1}$, where $I_{DS}$ denotes drain-source current, $I_{leak}$ denotes leakage current of the TFT, $I_b$ denotes a first current value that is a source-drain current value calculated in a regime below a threshold voltage, and $I_a$ denotes a second current value that is a source-drain current value calculated in a regime above a threshold voltage, wherein the first current value is determined by the following equations:

$$I_b=(WC/L)(K_b/(b+2))(V_{GF}^{b+2}-(V_{GF}-V_D)^{b+2}) \text{ when } V_{GF}>0, \text{ and}$$

$$I_b=0 \text{ when } V_{GF} \leq 0$$

where $V_{GF}$ denotes a difference between a gate voltage and a flat band voltage, W denotes a channel width, C denotes gate insulating capacitance, L denotes a channel length, $V_D$ denotes a drain voltage, and $K_b$ and b denote modeling variable values, and wherein the second current value is determined by the following equation:

$$I_a=(WC/L)(K_a/(a+2))(V_{GTe}^{a+2}-(V_{GTe}-V_D)^{a+2}),$$

where $V_{GTe}=(V_{min}/2)(1+(V_{GT}/V_{min})+(\Delta^2+(V_{GT}/V_{min}-1)^2)^{0.5})$. $V_{GT}$ denotes a difference between a gate voltage and a threshold voltage, W denotes a channel width, C denotes gate insulating capacitance, L denotes a channel length, $V_D$ denotes a drain voltage, $V_{min}$ denotes a minimum voltage, $K_a$ and a denote modeling variable values, and $\Delta$ denotes a variable indicating convergence strength.

5. The apparatus of claim 4, wherein the first current value and the second current value are applied based on the threshold voltage.

6. The apparatus of claim 4, wherein the TFT is one of an organic TFT, an oxide TFT and an amorphous silicon TFT.

7. The apparatus of claim 4, wherein the sample input values are a drain voltage value and a gate voltage value, and the sample output value is a source-drain current value measured according to the sample input values.

* * * * *